(12) United States Patent
Uejima

(10) Patent No.: US 11,107,782 B2
(45) Date of Patent: Aug. 31, 2021

(54) RADIO FREQUENCY MODULE AND COMMUNICATION DEVICE

(71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 95 days.

(21) Appl. No.: 16/569,910

(22) Filed: Sep. 13, 2019

(65) Prior Publication Data
US 2020/0203291 A1  Jun. 25, 2020

(30) Foreign Application Priority Data
Dec. 20, 2018 (JP) ............... JP2018-238364

(51) Int. Cl.
| | |
|---|---|
| H01L 23/66 | (2006.01) |
| H03F 3/21 | (2006.01) |
| H01L 23/31 | (2006.01) |
| H01L 23/552 | (2006.01) |
| H01L 25/16 | (2006.01) |

(Continued)

(52) U.S. Cl.
CPC .......... *H01L 23/66* (2013.01); *H01L 23/3121* (2013.01); *H01L 23/5383* (2013.01); *H01L 23/552* (2013.01); *H01L 25/16* (2013.01); *H03F 1/565* (2013.01); *H03F 3/21* (2013.01); *H03F 3/68* (2013.01); *H01L 24/16* (2013.01); *H01L 24/17* (2013.01); *H01L 2223/6616* (2013.01); *H01L 2223/6655* (2013.01); *H01L 2224/16225* (2013.01); *H01L 2224/1703* (2013.01); *H01L 2924/19042* (2013.01); *H01L 2924/19102* (2013.01); *H01L 2924/19105* (2013.01); *H01L 2924/3025* (2013.01); *H01L 2924/30111* (2013.01); *H03F 2200/222* (2013.01); *H03F 2200/249* (2013.01); *H03F 2200/294* (2013.01);

(Continued)

(58) Field of Classification Search
CPC ................. H01L 23/66; H03F 1/565
See application file for complete search history.

(56) References Cited

U.S. PATENT DOCUMENTS

| | | | |
|---|---|---|---|
| 7,012,327 B2 * | 3/2006 | Huff ............... | H01G 5/16 257/686 |
| 9,344,140 B2 | 5/2016 | Reisner et al. | |

(Continued)

FOREIGN PATENT DOCUMENTS

| | | |
|---|---|---|
| JP | 2003-243570 A | 8/2003 |
| JP | 2014-530543 A | 11/2014 |

(Continued)

*Primary Examiner* — Patricia T Nguyen
(74) *Attorney, Agent, or Firm* — Pearne & Gordon LLP

(57) ABSTRACT

A radio frequency module includes a mounting substrate, a low-noise amplifier including an amplifying element and amplifying a radio frequency signal, and an impedance matching circuit including an integrated first inductor, in which the first inductor is connected to an input terminal of the low-noise amplifier, the low-noise amplifier and the impedance matching circuit are laminated in a direction perpendicular to a main surface of the mounting substrate, and a first multilayer body on which the low-noise amplifier and the impedance matching circuit are laminated is mounted on the main surface.

17 Claims, 7 Drawing Sheets

(51) Int. Cl.
  *H03F 1/56* (2006.01)
  *H03F 3/68* (2006.01)
  *H01L 23/538* (2006.01)
  *H04B 1/40* (2015.01)
  *H01L 23/00* (2006.01)
(52) U.S. Cl.
  CPC .. *H03F 2200/387* (2013.01); *H03F 2200/451* (2013.01); *H04B 1/40* (2013.01)

(56) References Cited

U.S. PATENT DOCUMENTS

| | | | |
|---|---|---|---|
| 9,718,678 B2* | 8/2017 | Wachter | B81C 1/00238 |
| 2003/0127704 A1 | 7/2003 | Kobayashi et al. | |
| 2004/0238857 A1* | 12/2004 | Beroz | H01L 23/36 257/232 |
| 2005/0139981 A1* | 6/2005 | Kobayashi | H01L 23/3114 257/690 |
| 2005/0212106 A1* | 9/2005 | Kwon | H01L 23/4334 257/678 |
| 2006/0058000 A1* | 3/2006 | Block | H01P 5/10 455/333 |
| 2011/0254123 A1* | 10/2011 | Sellathamby | H01L 25/0655 257/531 |
| 2016/0093578 A1 | 3/2016 | Penunuri et al. | |
| 2020/0007096 A1 | 1/2020 | Kita | |
| 2020/0052404 A1* | 2/2020 | Eid | H01L 23/552 |

FOREIGN PATENT DOCUMENTS

| | | |
|---|---|---|
| WO | 2013/040272 A2 | 3/2013 |
| WO | 2014/017160 A1 | 1/2014 |
| WO | 2018/168500 A1 | 9/2018 |

* cited by examiner

RADIO FREQUENCY MODULE AND COMMUNICATION DEVICE

This application claims priority from Japanese Patent Application No. 2018-238364 filed on Dec. 20, 2018. The content of this application is incorporated herein by reference in its entirety.

BACKGROUND OF THE DISCLOSURE

1. Field of the Disclosure

The present disclosure relates to a radio frequency module and a communication device.

2. Description of the Related Art

In mobile communication devices such as mobile phones, an arrangement configuration of circuit elements configuring a radio frequency front-end circuit is complicated, in particular, with progress of multiband capability.

Japanese Unexamined Patent Application Publication (Translation of PCT Application) No. 2014-530543 discloses a circuit configuration of a wireless communication device (radio frequency circuit) including a transmission circuit and a reception circuit. In this wireless communication device, connection between the transmission circuit and an antenna, or connection between the reception circuit and the antenna is switched by a switch connected to the antenna. The transmission circuit includes a power amplifier (PA) and a transmission impedance matching circuit arranged between the power amplifier and the switch. The reception circuit includes a low-noise amplifier (LNA) and a reception impedance matching circuit arranged between the low-noise amplifier and the switch.

However, in a case where a wireless communication device (radio frequency circuit) disclosed in Japanese Unexamined Patent Application Publication (Translation of PCT Application) No. 2014-530543 is configured with one module as a compact front-end circuit of a mobile communication device, for example, when wiring connecting a reception impedance matching circuit to an input terminal of a low-noise amplifier is long, stray capacitance is generated in the wiring. As a result, there is a problem in which impedance matching between the low-noise amplifier and a circuit element in the preceding stage of the low-noise amplifier becomes insufficient, and then reception sensitivity of a radio frequency reception signal outputted from the low-noise amplifier deteriorates.

BRIEF SUMMARY OF THE DISCLOSURE

The present disclosure has been made to solve the above problem, and an object of the present disclosure is to provide a radio frequency module and a communication device that are capable of suppressing degradation in reception sensitivity.

In order to achieve the above object, a radio frequency module according to one aspect of the present disclosure includes a mounting substrate, a low-noise amplifier that includes an amplifying element and amplifies a radio frequency signal, and a first integrated passive element that includes an integrated first inductor, in which the first inductor is connected to an input terminal of the low-noise amplifier, the low-noise amplifier and the first integrated passive element are laminated in a direction perpendicular to a main surface of the mounting substrate, and a first multi-layer body in which the low-noise amplifier and the first integrated passive element are laminated is mounted on the main surface.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
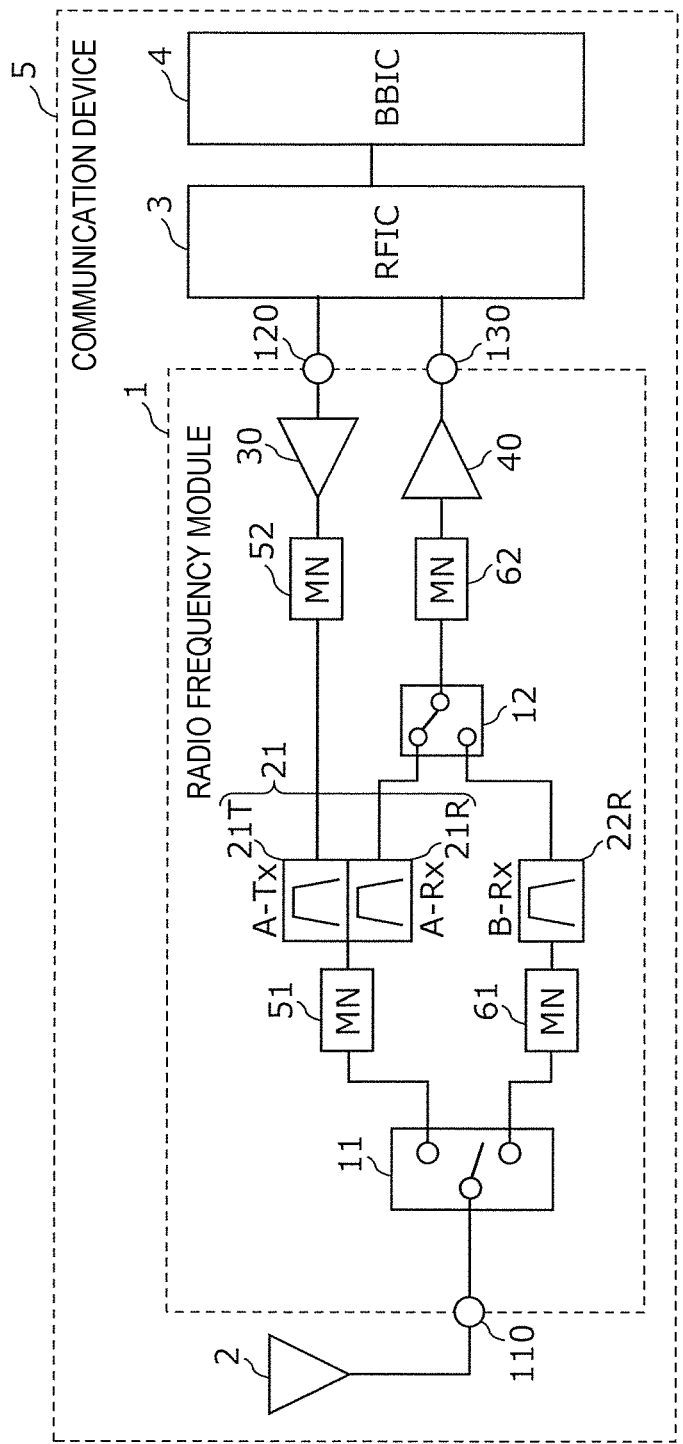
FIG. 1 is a circuit configuration diagram of a communication device according to an embodiment.

Hereinafter, the embodiment of the present disclosure and the modifications thereof will be described in detail with reference to the accompanying drawings. It should be noted that the embodiment and modifications thereof described below are intended to be all inclusive or specific examples. The numerical values, shapes, materials, constituent elements, arrangement and connection forms of the constituent elements shown in the following embodiment and modifications thereof are merely examples, and are not intended to limit the present disclosure. Among the constituent elements in the following embodiment and modifications thereof, constituent elements not described in the independent claims are described as arbitrary constituent elements. Also, sizes or ratios of the sizes of the constituent elements illustrated in the drawings are not necessarily critical.

In the following embodiment, as for A, B, and C mounted on a substrate, "in a plan view of the substrate (or a main surface of the substrate), C is arranged between A and B" is defined that at least part of a region of C projected in the plan view of the substrate is overlapped with a line connecting an arbitrary point in a region of A projected in the plan view of the substrate and an arbitrary point in a region of B projected in the plan view of the substrate.

Also, in this specification, a term indicating a relationship between elements (for example, the term "vertical", "parallel", or the like), and a term indicating a shape of an element, as well as a numerical range, are representations that mean to be substantially equivalent, for example, including about a few percentages different, rather than a representation indicating only a strict sense.

In the following embodiment and variations thereof, "A and B are connected" is defined not only to indicate that A and B are in contact with each other but also to include that A and B are electrically connected via conductor wiring.

Embodiments

1. Circuit Configuration of Radio Frequency Module 1 and Communication Device 5

FIG. 1 is a circuit configuration diagram of the radio frequency module 1 according to the embodiment. As illustrated in the same figure, the communication device 5 includes a radio frequency module 1, an antenna 2, an RF signal processing circuit (RFIC) 3, and a baseband signal processing circuit (BBIC) 4.

The RFIC 3 is an RF signal processing circuit for processing a radio frequency signal to be transmitted and received by the antenna 2. Specifically, the RFIC 3 performs signal processing on a radio frequency reception signal inputted through a reception signal path of the radio frequency module 1 by down-conversion or the like, and outputs a reception signal generated by performing the signal processing to the BBIC 4. The RFIC 3 performs signal processing on a transmission signal inputted from the BBIC 4 by up-conversion or the like, and outputs a radio frequency transmission signal generated by the signal processing to a transmission signal path of the radio frequency module 1.

The BBIC 4 is a circuit that performs signal processing by using an intermediate frequency band having a lower frequency than a radio frequency signal transmitted through the radio frequency module 1. A signal processed in the BBIC 4 is used, for example, as an image signal for image display, or as a voice signal for a telephone call via a speaker.

The RFIC 3 also has a function as a control unit for controlling connection of a switch 11 included in the radio frequency module 1 based on a communication band (frequency band) to be used. Specifically, the RFIC 3 switches the connection of the switch 11 included in the radio frequency module 1 by a control signal (not illustrated). Note that the control unit may be provided outside the RFIC 3, or may be provided in the radio frequency module 1 or the BBIC 4, for example.

The antenna 2 is connected to an input/output terminal 110 of the radio frequency module 1, emits a radio frequency signal outputted from the radio frequency module 1, and receives a radio frequency signal from the outside, and outputs the radio frequency signal to the radio frequency module 1.

Note that, in the communication apparatus 5 according to the present embodiment, the antenna 2 and the BBIC 4 are not essential constituent elements.

Next, a detailed configuration of the radio frequency module 1 will be described.

As illustrated in FIG. 1, the radio frequency module 1 includes the input/output terminal 110, a reception terminal 130, a transmission terminal 120, a low-noise amplifier 40, a power amplifier 30, impedance matching circuits 51, 52, 61 and 62, switches 11 and 12, reception filters 21R and 22R, and a transmission filter 21T.

The Low-Noise Amplifier (LNA) 40 includes an amplifying element such as a bipolar transistor or a field effect transistor, for example, to preferentially amplify radio frequency signals of communication bands A and B with low noise. The low-noise amplifier 40 is arranged on a reception path of the radio frequency module 1.

The Power Amplifier (PA) 30 includes an amplifying element such as a bipolar transistor or a field effect transistor, and preferentially amplifies the power of a radio frequency signal of, for example, the band A. The power amplifier 30 is arranged on a transmission path of the radio frequency module 1.

The low-noise amplifier 40 and the power amplifier 30 are configured with, for example, a Si based Complementary Metal Oxide Semiconductor (CMOS), a field effect transistor (FET) made of GaAs, a hetero bipolar transistor (HBT), or the like.

The reception filter 21R is arranged on a first reception path connecting the switches 11 and 12, and passes a radio frequency reception signal in a reception band of the communication band A among radio frequency reception signals inputted from the input/output terminal 110. The reception filter 22R is arranged on a second reception path connecting the switches 11 and 12, and passes a radio frequency reception signal in a reception band of the communication band B among the radio frequency reception signals inputted from the input/output terminal 110.

The transmission filter 21T is arranged on a transmission path connecting the switch 11 and the power amplifier 30, and passes a radio frequency transmission signal in a transmission band of the communication band A among radio frequency transmission signals amplified by the power amplifier 30.

Note that the above-mentioned reception filters 21R and 22R and the transmission filter 21T may be, for example, any one of a surface acoustic wave filter, an acoustic wave filter using a Bulk Acoustic Wave (BAW) filter, an LC resonance filter, and a dielectric filter, and is not limited thereto.

The transmission filter 21T and the reception filter 21R configure a duplexer 21 whose pass band is set to be the communication band A.

The switch 11 is arranged on a path connecting the input/output terminal 110 and the reception filter 22R, and on a path connecting the input/output terminal 110 and the duplexer 21. With this arrangement configuration, the switch 11 switches between connection between a signal path for transmitting a radio frequency signal in the communication band A and the input/output terminal 110, and connection between a signal path for transmitting a radio frequency signal in the communication band B and the input/output terminal 110. The switch 11 is configured with, for example, a Single Pole Double Throw (SPDT) type switch circuit.

The switch 12 is arranged on a path connecting the reception filter 21R and the low-noise amplifier 40, and on a path connecting the reception filter 22R and the low-noise amplifier 40. With this arrangement configuration, the switch 12 switches between connection between the reception filter 21R and the low-noise amplifier 40 and connection between the reception filter 22R and the low-noise amplifier 40. The switch 12 is configured with, for example, an SPDT type switch circuit.

The switches 11 and 12 may be made of, for example, a Si based CMOS or GaAs.

The impedance matching circuit 52 is arranged on a path connecting the power amplifier 30 and the transmission filter 21T, and matches an output impedance of the power amplifier 30 with an input impedance of the transmission filter 21T. In the present embodiment, the impedance matching circuit 52 includes an inductor (third inductor) connected to the power amplifier 30.

The impedance matching circuit 62 is arranged on a path connecting the switch 12 and the low-noise amplifier 40 to match output impedances of the reception filters 21R and 22R with an input impedance of the low-noise amplifier 40. In this embodiment, the impedance matching circuit 62 includes an inductor (first inductor) connected to the low-noise amplifier 40. That is, the first inductor is an impedance matching element for matching an output impedance of a circuit element arranged in the preceding stage of the low-noise amplifier 40 with the input impedance of the low-noise amplifier 40.

The impedance matching circuit 51 is arranged on a path connecting the switch 11 and the duplexer 21, and impedance matching between the antenna 2 and the switch 11, and the duplexer 21, is performed.

The impedance matching circuit 61 is arranged on a path connecting the switch 11 and the reception filter 22R, and impedance matching between the antenna 2 and the switch 11, and the reception filter 22R, is performed. In this embodiment, the impedance matching circuit 61 includes an inductor (second inductor) connected to the switch 11.

According to the above circuit configuration of the radio frequency module 1, it is possible to perform at least one of transmission and reception of a radio frequency signal in the communication band A and reception of a radio frequency signal in the communication band B.

It should be noted that the radio frequency module according to the present disclosure may include at least the low-noise amplifier 40 and the impedance matching circuit 62 connected to an input terminal of the low-noise amplifier 40, among the constituent elements of the radio frequency module 1 according to the embodiment.

Therefore, the number of communication bands in which the radio frequency module according to the present disclosure can transmit is arbitrary, and the presence or absence of simultaneous transmission of a transmission signal and a reception signal in the same communication band and the presence or absence of simultaneous transmission of signals between different communication bands are also arbitrary.

In a case where each of the circuit elements configuring the radio frequency module 1 is configured with one module as a compact front-end circuit, when wiring connecting the low-noise amplifier 40 and the impedance matching circuit 62 is long, stray capacitance is generated in the wiring, and impedance matching between the low-noise amplifier 40 and the circuit elements in the preceding stage (switch 12, reception filters 21R and 22R) is insufficient, thereby deteriorating the reception sensitivity of the radio frequency reception signal outputted from the low-noise amplifier 40.

On the contrary, the radio frequency module 1 according to the present embodiment has a configuration in which the wiring connecting the low-noise amplifier 40 and the impedance matching circuit 62 is shortened to suppress the generation of the stray capacitance. Hereinafter, a configuration for suppressing the generation of the stray capacitance while reducing a size of the radio frequency module 1 will be described.

2. Circuit Element Arrangement Configuration of Radio Frequency Module 1

Figure 2:
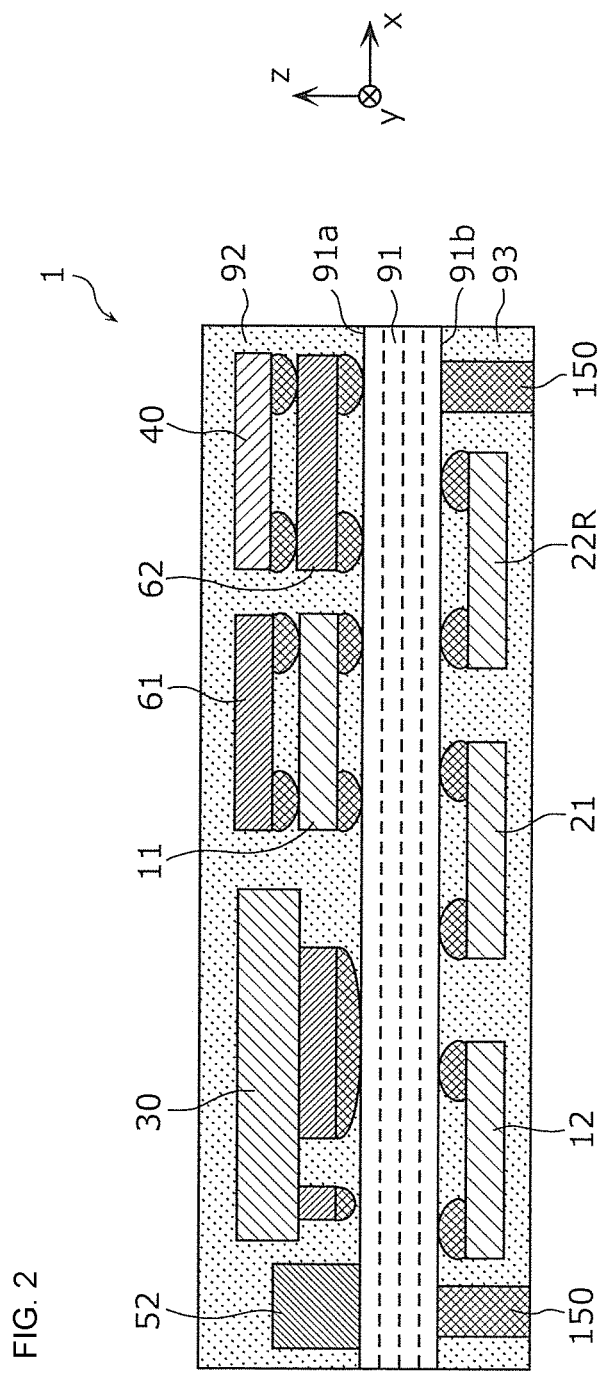
FIG. 2 is a schematic cross-sectional view of a radio frequency module according to the embodiment.

FIG. 2 is a schematic cross-sectional view of the radio frequency module 1 according to the embodiment. As illustrated in FIG. 2, the radio frequency module 1 according to the present embodiment further includes a mounting substrate 91, resin members 92 and 93, and an external connection conductor 150, in addition to the circuit configuration illustrated in FIG. 1.

The mounting substrate 91 has a main surface 91a (first main surface) and a main surface 91b (second main surface) opposite to each other, and is a substrate on which the circuit elements and components configuring the radio frequency module 1 are mounted. As the mounting substrate 91, for example, a Low Temperature Co-fired Ceramics (LTCC) substrate having a laminated structure of a plurality of dielectric layers, a printed circuit board or the like is used.

The impedance matching circuit 62 is a first Integrated Passive Device (first IPD) in which the first inductor is integrated and mounted inside a second substrate or on a surface of the second substrate.

As illustrated in FIG. 2, the low-noise amplifier 40 and the impedance matching circuit 62 are laminated in a direction perpendicular to the main surface 91a of the mounting substrate 91 (z-axis direction). The first multilayer body in which the low-noise amplifier 40 and the impedance matching circuit 62 are laminated is mounted on the main surface 91a.

According to the above configuration of the radio frequency module 1, since the low-noise amplifier 40 and the impedance matching circuit 62 are laminated in the direction (z-axis direction) perpendicular to the main surface 91a of the mounting substrate 91, a mounting surface of the mounting substrate 91 can be reduced in area. Therefore, the radio frequency module 1 can be made smaller in size. Further, since the low-noise amplifier 40 and the impedance matching circuit 62 are laminated in the z-axis direction, the wiring connecting the low-noise amplifier 40 and the impedance matching circuit 62 can be shortened. Thereby, the stray capacitance generated in the wiring can be reduced, so that the impedance matching between the low-noise amplifier 40 and the circuit elements (switch 12, reception filters 21R and 22R) in the preceding stage can be performed with high accuracy. Therefore, it is possible to suppress the deterioration in the reception sensitivity of a radio frequency reception signal outputted from the low-noise amplifier 40.

In the radio frequency module 1 according to the present embodiment, the low-noise amplifier 40 includes a first substrate on which an amplifying element is mounted. On the other hand, the impedance matching circuit 62 includes the second substrate on which the first inductor is integrated and mounted. Here, the first substrate and the second substrate may be made of silicon.

According to this, since the first substrate and the second substrate of the same material are laminated in the first multilayer body configured with the low-noise amplifier 40 and the impedance matching circuit 62, it is possible to suppress the low-noise amplifier 40 and the impedance matching circuit 62 from being separated or damaged due to a difference in coefficient of linear expansion in thermal cycles.

In the first multilayer body described above, for example, the input terminal of the low-noise amplifier 40 is formed on a lower surface of the first substrate, one terminal of the first inductor is formed on an upper surface of the impedance matching circuit 62, and the input terminal of the low-noise amplifier 40 and the one terminal of the first inductor are connected to each other via, for example, bump electrodes. Further, another terminal of the first inductor is formed on a lower surface of the impedance matching circuit 62, and the other terminal of the first inductor and the main surface 91a are connected to each other via, for example, bump electrodes.

Note that the bump electrode in this embodiment is a ball-shaped electrode made of a highly conductive metal, and examples thereof include a solder bump made of Sn/Ag/Cu and a bump containing Au as a main component. Alternatively, for example, an electrode formed by solder paste may be used instead of the bump electrode.

In this specification, a main surface close to the mounting substrate 91 of the main surfaces opposite to each other of the substrate is referred to as a lower surface, and a main surface far from the mounting substrate 91 is referred to as an upper surface.

In this embodiment, the impedance matching circuit 62 (first integrated passive element) is arranged between the mounting substrate 91 and the low-noise amplifier 40 in a cross-sectional view of the mounting substrate 91.

In the radio frequency module 1 according to the present embodiment, the power amplifier 30 is mounted on the main surface 91*a*. Additionally, the impedance matching circuit 52 may be configured with the chip-shaped third inductor, and may be mounted on the main surface 91*a* without being laminated with the power amplifier 30. The input/output terminal formed on a lower surface of the power amplifier 30 and the main surface 91*a* are connected to each other via, for example, bump electrodes. Note that, in order to improve the heat dissipation performance of the power amplifier 30, an electrode for heat dissipation formed on the lower surface of the power amplifier 30 may be bonded to the main surface 91*a*, and a bonding wire may be formed on the main surface 91*a* from an upper surface of the power amplifier 30.

In a case where the power amplifier 30 is configured with, for example, an HBT made of GaAs, when an IPD made of silicon is laminated and arranged in the power amplifier 30, a multilayer body of chips made of different materials such as GaAs and Si is formed. In this case, in a multilayer body of a Si chip and a GaAs chip having different coefficients of linear expansion, the temperature of the multilayer body is changed due to the heat generated when the power amplifier 30 operates, and stress is generated at a junction of two chips, thereby causing problems such as a crack and mounting failure. Further, when the heat of the power amplifier 30 is conducted to a Si chip, it is assumed that characteristics of a circuit element formed on the Si chip are changed.

In contrast, according to the above configuration of the radio frequency module 1 according to the present embodiment, since the impedance matching circuit 52 is not in a laminated relationship with the power amplifier 30, the occurrence of the crack and the mounting failure in the impedance matching circuit 52 can be prevented, and characteristic change of the impedance matching circuit 52 due to the heat generation of the power amplifier 30 can be suppressed.

In the radio frequency module 1 according to the present embodiment, the switch 11 is mounted on the main surface 91*a* and may be arranged between the power amplifier 30 and the first multilayer body in a plan view of the main surface 91*a*.

According to this configuration, since the switch 11 is arranged between the power amplifier 30 configuring a transmission circuit and the low-noise amplifier 40 configuring a reception circuit, it is possible to suppress the leakage of a high-power transmission signal to the low-noise amplifier 40, thereby improving the isolation between the transmission circuit and the reception circuit.

In the radio frequency module 1 according to the present embodiment, the impedance matching circuit 61 includes a second inductor, and the second inductor is a second integrated passive element (second IPD) integrated and mounted inside of a third substrate or on a surface of the third substrate. As illustrated in FIG. 2, the switch 11 and the impedance matching circuit 61 may be laminated in the direction (z-axis direction) perpendicular to the main surface 91*a* of the mounting substrate 91. Moreover, a second multilayer body in which the switch 11 and the impedance matching circuit 61 are laminated may be mounted on the main surface 91*a*.

Since the switch 11 and the impedance matching circuit 61 are laminated in the direction (z-axis direction) perpendicular to the main surface 91*a* of the mounting substrate 91, the mounting surface of the mounting substrate 91 can be reduced in area, thereby making it possible to reduce the size of the radio frequency module 1. Further, since the switch 11 and the impedance matching circuit 61 are laminated in the z-axis direction, wiring connecting the switch 11 and the impedance matching circuit 61 can be shortened. Thus, stray capacitance generated in the wiring can be reduced, so that a transmission loss in a reception path for the communication band B can be reduced.

Moreover, since the second multilayer body is arranged between the power amplifier 30 and the first multilayer body, the second multilayer body can block a leakage component (electromagnetic field) of a transmission signal from the power amplifier 30, so that it is possible to suppress the characteristic variation of the low-noise amplifier 40 due to an unwanted wave from the power amplifier 30.

Further, the switch 11 may be configured with a Si based CMOS, and the third substrate may be made of silicon.

According to this, since the circuit element using silicon as a base material is laminated in the second multilayer body, it is possible to prevent the switch 11 and the impedance matching circuit 61 from being separated from each other or broken due to a difference in coefficient of linear expansion in thermal cycles.

In the second multilayer body of the switch 11 and the impedance matching circuit 61, a terminal of the second inductor is formed on a lower surface of the third substrate, one terminal of the switch 11 is formed on an upper surface of the switch 11, and the terminal of the second inductor and the one terminal of the switch 11 are connected to each other via, for example, bump electrodes. Further, another terminal of the switch 11 is formed on a lower surface of the switch 11, and the other terminal of the switch 11 and the main surface 91*a* are connected to each other via, for example, bump electrodes. Note that, for example, an electrode formed with solder paste may be used instead of the bump electrode.

The second multilayer body may be formed by laminating the switch 11 and the impedance matching circuit 51. According to this configuration, the stray capacitance generated in wiring connecting the switch 11 and the impedance matching circuit 51 can be reduced, so that the transmission loss in a reception path of the communication band A can be reduced.

Additionally, in the radio frequency module 1 according to the present embodiment, the switch 12, the duplexer 21, and the reception filter 22R are further mounted on the main surface 91*b* of the mounting substrate 91. Further, the external connection conductor 150 for connecting the main surface 91*b* to an external substrate is formed on the main surface 91*b*. Further, the resin member 92 covering at least a part of the power amplifier 30, the first multilayer body, the second multilayer body, and the impedance matching circuit 52 is arranged on the main surface 91*a*. The resin member 93 covering at least a part of the switch 12, the duplexer 21, the reception filter 22R, and the external connection conductor 150 is arranged on the main surface 91*b*. The arrangement of the resin members 92 and 93 enhances reliability, such as air tightness, heat resistance, water and humidity resistance, and insulation properties, of the above circuit elements and components configuring the radio frequency module 1.

The external connection conductor 150 is, for example, a columnar conductor using a metal such as Cu or conductive paste filled in a through via hole formed in the resin member 93.

The resin members 92 and 93 may be, for example, thermosetting epoxy resin, and may further contain an inorganic filler such as $SiO_2$. Note that the resin members 92 and 93 are not essential constituent elements for the radio frequency module according to the present disclosure.

Further, the power amplifier 30, the second multilayer body, the switch 12, the duplexer 21, the reception filter 22R, and the external connection conductor 150 may be mounted on either the main surfaces 91a or 91b, or may be incorporated in the mounting substrate 91.

3. Circuit Element Arrangement Configuration of the Radio Frequency Module 1A according to First Modification In the radio frequency module 1 according to the present embodiment, the configuration in which the circuit elements and components are distributed to both surfaces (main surfaces 91a and 91b) of the mounting substrate 91 is exemplified, but these circuit elements and components may be mounted on one surface of the mounting substrate 91.

Figure 3:
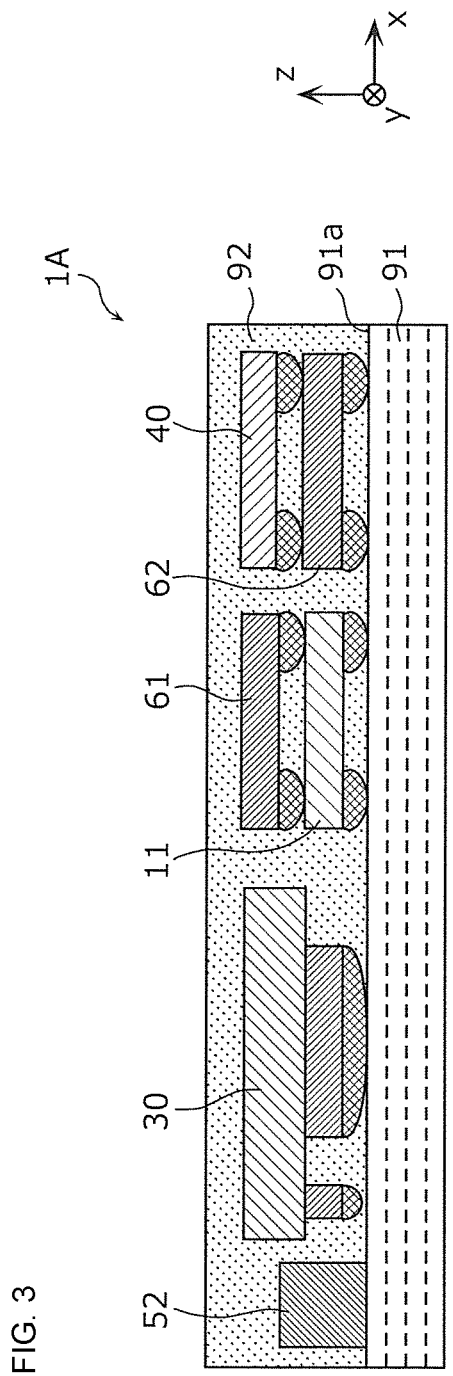
FIG. 3 is a schematic cross-sectional view of a radio frequency module according to a first modification of the embodiment.

FIG. 3 is a schematic cross-sectional view of a radio frequency module 1A according to a first modification of the embodiment. The same figure illustrates a configuration in which the power amplifier 30, the first multilayer body (low-noise amplifier 40 and impedance matching circuit 62), the second multilayer body (switch 11 and impedance matching circuit 61), and the impedance matching circuit 52 are mounted on the main surface 91a. Although not illustrated in the figure, the switch 12, the duplexer 21, and the reception filter 22R are also mounted on the main surface 91a. That is, the radio frequency module 1A according to the present modification has a configuration in which the circuit elements and components of the radio frequency module 1A are mounted on one side.

Even in this configuration, since the low-noise amplifier 40 and the impedance matching circuit 62 are laminated in the direction (z-axis direction) perpendicular to the main surface 91a of the mounting substrate 91, the mounting surface of the mounting substrate 91 can be reduced in area, and the radio frequency module 1A can be miniaturized. Further, since the low-noise amplifier 40 and the impedance matching circuit 62 are laminated in the z-axis direction, the wiring connecting the low-noise amplifier 40 and the impedance matching circuit 62 can be shortened. Thus, the stray capacitance generated in the wiring can be reduced, so that the impedance matching between the low-noise amplifier 40 and the circuit elements (switch 12 and reception filters 21R and 22R) in the preceding stage can be performed with high accuracy. Therefore, it is possible to suppress the deterioration in the reception sensitivity of a radio frequency reception signal outputted from the low-noise amplifier 40. Further, since the circuit elements and components configuring the radio frequency module 1A are mounted on one side, a height of the radio frequency module 1A can be reduced.

Figure 4:
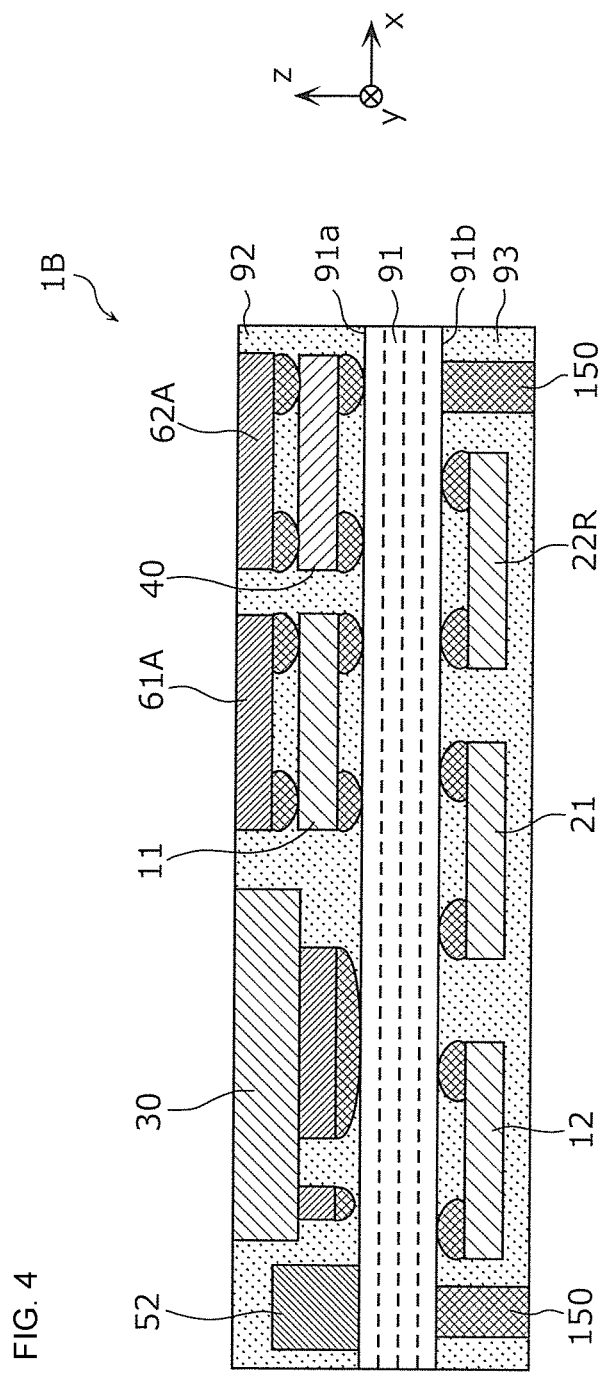
FIG. 4 is a schematic cross-sectional view of a radio frequency module according to a second modification of the embodiment.

4. Circuit Element Arrangement Configuration of Radio Frequency Module 1B according to Second Modification FIG. 4 is a schematic cross-sectional view of a radio frequency module 1B according to a second modification of the embodiment. The radio frequency module 1B illustrated in the same figure is different from the radio frequency module 1 according to the embodiment in that a laminating order of the low-noise amplifier 40 and an impedance matching circuit 62A configuring the first multilayer body is reversed, and in that the upper surfaces of the power amplifier 30 and the impedance matching circuits 61A and 62A are exposed from the resin member. Hereinafter, with respect to the radio frequency module 1B according to this modification, the same configuration as the radio frequency module 1 according to the embodiment will not be described, and a different configuration will be mainly described.

As illustrated in FIG. 4, the low-noise amplifier 40 and the impedance matching circuit 62A are laminated in the direction (Z-axis direction) perpendicular to the main surface 91a of the mounting substrate 91. The first multilayer body in which the low-noise amplifier 40 and the impedance matching circuit 62A are laminated is mounted on the main surface 91a.

The impedance matching circuit 62A is arranged on a path connecting the switch 12 and the low-noise amplifier 40, and matches the output impedances of the reception filters 21R and 22R with the input impedance of the low-noise amplifier 40. The impedance matching circuit 62A includes an inductor (first inductor) connected to the low-noise amplifier 40.

The impedance matching circuit 61A is arranged on a path connecting the switch 11 and the reception filter 22R, and the impedance matching between the antenna 2 and the switch 11, and the reception filter 22R, is performed. The impedance matching circuit 61A includes an inductor (second inductor) connected to the switch 11.

The impedance matching circuit 62A is a first integrated passive element (first IPD) in which the first inductor is integrated and mounted inside of a second substrate or on a surface of the second substrate.

The impedance matching circuit 61A is a second integrated passive element (second IPD) in which the second inductor is integrated and mounted inside of a third substrate or on a surface of the third substrate.

As illustrated in FIG. 4, the low-noise amplifier 40 and the impedance matching circuit 62A are laminated in the direction (Z-axis direction) perpendicular to the main surface 91a of the mounting substrate 91. The low-noise amplifier 40 is arranged between the mounting substrate 91 and the impedance matching circuit 62A in a cross-sectional view of the mounting substrate 91. That is, the impedance matching circuit 62A is arranged above the low-noise amplifier 40 (z-axis positive direction).

As illustrated in FIG. 4, the switch 11 and the impedance matching circuit 61A are laminated in the direction perpendicular to the main surface 91a of the mounting substrate 91 (z-axis direction). The switch 11 is arranged between the mounting substrate 91 and the impedance matching circuit 61A in a cross-sectional view of the mounting substrate 91. That is, the impedance matching circuit 61A is arranged above the switch 11 (z-axis positive direction).

Here, the power amplifier 30, and the impedance matching circuits 61A and 62A are exposed from a top surface of the resin member 92 (the surface on the z-axis positive direction side).

In the first multilayer body described above, the input terminal of the low-noise amplifier 40 is formed on the upper surface of the first substrate, a terminal of the first inductor is formed on a lower surface of the impedance matching circuit 62A, and the input terminal of the low-noise amplifier 40 and the terminal of the first inductor are connected to each other via, for example, bump electrodes. Further, an output terminal of the low-noise amplifier 40 is formed on a lower surface thereof, and the output terminal of the low-noise amplifier 40 and the main surface 91a are connected to each other via, for example, bump electrodes.

In the second multilayer body described above, a terminal of the second inductor is formed on the lower surface of the third substrate, one terminal of the switch 11 is formed on the upper surface of the switch 11, and the terminal of the second inductor and the one terminal of the switch 11 are connected to each other via, for example, bump electrodes. Further, the other terminal of the switch 11 is formed on the lower surface of the switch 11, and the other terminal of the switch 11 and the main surface 91a are connected to each other via, for example, bump electrodes.

According to the above configuration, since a bump electrode is not formed on the upper surfaces of the impedance matching circuits 61A and 62A, by arranging the respective upper surfaces on an outer surface of the radio frequency module 1B, it is possible to grind the outer surface, so that a height of the radio frequency module 1B can be reduced. Even when an integrated passive element such as the impedance matching circuits 61A and 62A is thinned by grinding a main surface thereof, the integrated passive element has less change in characteristics than active elements such as the low-noise amplifier 40 and the switch 11.

Figure 5:
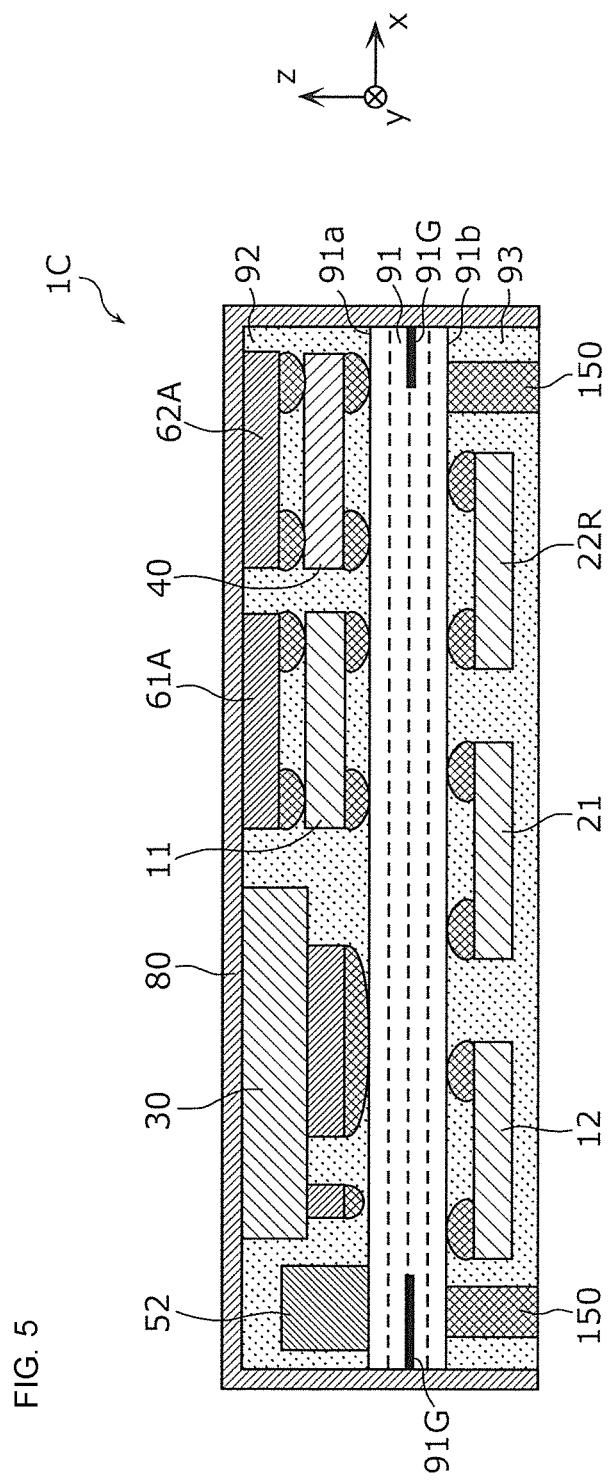
FIG. 5 is a schematic cross-sectional view of a radio frequency module according to a third modification of the embodiment.

5. Circuit Element Arrangement Configuration of Radio Frequency Module 1C according to Third Modification FIG. 5 is a schematic cross-sectional view of a radio frequency module 1C according to a third modification of the embodiment. The radio frequency module 1C illustrated in the same figure is different from the radio frequency module 1B according to the second modification in that the radio frequency module 1C includes a shield electrode layer 80. Hereinafter, with respect to the radio frequency module 1C according to this modification, the same configuration as the radio frequency module 1B according to the second modification will not be described, and a different configuration will be mainly described.

The radio frequency module 1C further includes the shield electrode layer 80 formed so as to cover the top surface and side surfaces of the resin members 92 and 93, and connected to a ground electrode pattern 91G in the mounting substrate 91.

The shield electrode layer 80 is formed, for example, by vacuum film deposition, such as sputtering or vapor deposition, of a metal, such as Ag or the like, or by spin coating a conductive paste. The shield electrode layer 80 is connected to the ground electrode pattern 91G formed on the mounting substrate 91 at a side surface of the mounting substrate 91.

According to the configuration described above, an unwanted wave entering from the outside of the radio frequency module 1C can be blocked, so that the variation in module characteristics can be suppressed. Further, by bringing the shield electrode layer 80 into contact with the upper surface of the power amplifier 30, the heat generated by the power amplifier 30 can be dissipated to the outside of the radio frequency module 1C through the shield electrode layer 80, so that the heat dissipation can be improved.

Figure 6:
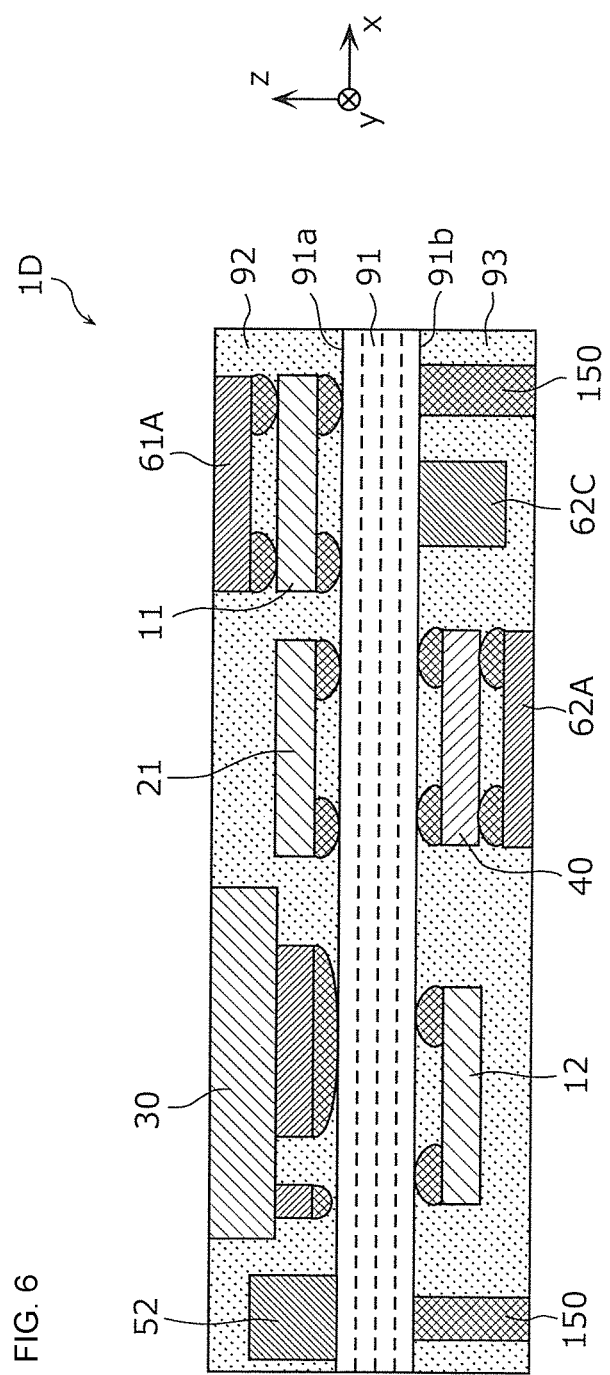
FIG. 6 is a schematic cross-sectional view of a radio frequency module according to a fourth modification of the embodiment.

6. Circuit Element Arrangement Configuration of Radio Frequency Module 1D according to Fourth Modification FIG. 6 is a schematic cross-sectional view of a radio frequency module 1D according to a fourth modification of the embodiment. The radio frequency module 1D illustrated in the same figure is different from the radio frequency module 1B according to the second modification in that the first multilayer body and an impedance matching circuit 62C are mounted on the main surface 91b, and in that the duplexer 21 is mounted on the main surface 91a. Hereinafter, with respect to the radio frequency module 1D according to this modification, the same configuration as the radio frequency module 1B according to the second modification will not be described, and a different configuration will be mainly described.

The power amplifier 30 and the impedance matching circuit 52 are mounted on the main surface 91a and the first multilayer body (the low-noise amplifier 40 and the impedance matching circuit 62A) is mounted on the main surface 91b.

The impedance matching circuit 62C is arranged on the path connecting the switch 12 and the low-noise amplifier 40, and matches the output impedances of the reception filters 21R and 22R with the input impedance of the low-noise amplifier 40. That is, in this modification, the impedance matching circuits 62A and 62C are arranged on the path connecting the switch 12 and the low-noise amplifier 40. The impedance matching circuit 62C is, for example, a chip-shaped inductor.

In this modification, the impedance matching circuit 62C may not be provided.

In this modification, although the reception filter 22R is not illustrated in the cross-sectional view in FIG. 6, the reception filter 22R may be arranged on either the main surface 91a or the main surface 91b.

According to the above configuration, the low-noise amplifier 40 and the power amplifier 30 are mounted on the main surfaces 91b and 91a of the mounting substrate 91, respectively. The impedance matching circuits 62A and 62C, and the impedance matching circuit 52 are mounted on the main surfaces 91b and 91a of the mounting substrate 91, respectively.

As a result, the low-noise amplifier 40 and the impedance matching circuits 62A and 62C, and the power amplifier 30 and the impedance matching circuit 52 are separated with the mounting substrate 91 interposed therebetween, so that the isolation between the transmission and reception in the radio frequency module 1D is further improved.

Further, by grinding an upper surface of the first multilayer body together with a surface of the resin member 93, it is possible to reduce a height of the radio frequency module 1D on both a main surface 91a side and a main surface 91b side.

Figure 7:
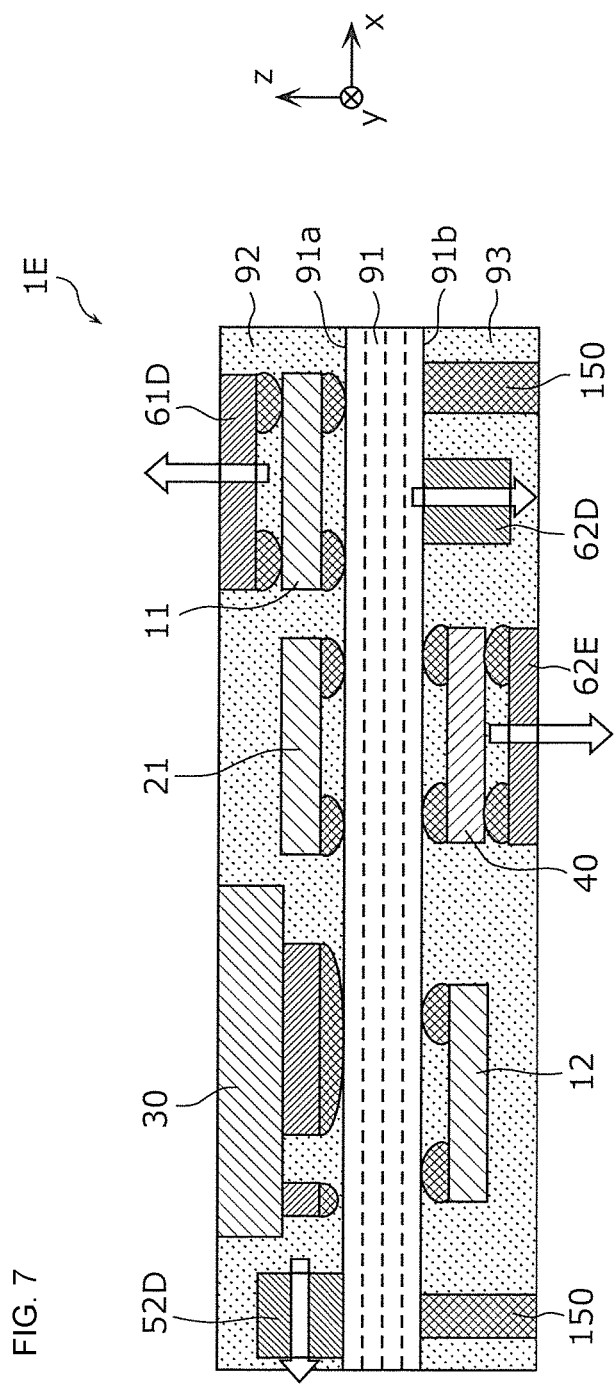
FIG. 7 is a schematic cross-sectional view of a radio frequency module according to a fifth modification of the embodiment.

7. Circuit Element Arrangement Configuration of Radio Frequency Module 1E according to Fifth Modification FIG. 7 is a schematic cross-sectional view of a radio frequency module 1E according to a fifth modification of the embodiment. The radio frequency module 1E illustrated in the same figure is different from the radio frequency module 1D according to the fourth modification in that a magnetic flux direction of the inductor configuring each impedance matching circuit is defined. Hereinafter, with respect to the radio frequency module 1E according to this modification, the same configuration as the radio frequency module 1D according to the fourth modification will not be described, and a different configuration will be mainly described.

An impedance matching circuit 61D is arranged on a path connecting the switch 11 and the reception filter 22R, and the impedance matching between the antenna 2 and the switch 11, and the reception filter 22R is performed. The impedance matching circuit 61D includes an inductor (second inductor) connected to the switch 11. The impedance matching circuit 61D is a second integrated passive element (second IPD) in which the second inductor is integrated and mounted inside of a third substrate or on a surface of the third substrate.

An impedance matching circuit 62E is arranged on a path connecting the switch 12 and the low-noise amplifier 40, and matches the output impedances of the reception filters 21R and 22R with the input impedance of the low-noise amplifier 40. The impedance matching circuit 62E includes an inductor (first inductor) connected to the low-noise amplifier 40. The impedance matching circuit 62E is a first integrated passive element (first IPD) in which the first inductor is integrated and mounted inside of a second substrate or on a surface of the second substrate.

An impedance matching circuit 62D is arranged on the path connecting the switch 12 and the low-noise amplifier 40, and matches the output impedances of the reception filters 21R and 22R with the input impedance of the low-noise amplifier 40. That is, in this modification, impedance matching circuits 62E and 62D are arranged on the path connecting the switch 12 and the low-noise amplifier 40. The impedance matching circuit 62D is, for example, a chip-shaped inductor. In this modification, the impedance matching circuit 62D may not be provided.

An impedance matching circuit 52D is arranged on a path connecting the power amplifier 30 and the transmission filter 21T, and matches the output impedance of the power amplifier 30 with an input impedance of the transmission filter 21T. In this modification, the impedance matching circuit 52D includes an inductor (third inductor) connected to the power amplifier 30.

Here, a magnetic flux direction of the first inductor of the impedance matching circuit 62E and a magnetic flux direction of the inductor of the impedance matching circuit 62D are a direction perpendicular to the main surface 91b. In contrast, a magnetic flux direction of the third inductor of the impedance matching circuit 52D is a direction parallel to the main surface 91a.

In the third inductor of the impedance matching circuit 52D, a winding axis of a coil conductor wound in a spiral shape is parallel to the main surface 91a. In the inductor of the impedance matching circuit 62D, a winding axis of a coil conductor wound in a spiral shape is perpendicular to the main surface 91b. Further, the first inductor of the impedance matching circuit 62E includes a spiral planar coil conductor, and its winding axis is perpendicular to the main surface 91b.

According to the above configuration, both the magnetic flux direction of the first inductor of the impedance matching circuit 62E and the magnetic flux direction of the inductor of the impedance matching circuit 62D, and the magnetic flux direction of the third inductor of the impedance matching circuit 52D are mutually orthogonal, so that magnetic field coupling between them can be suppressed. Therefore, unnecessary coupling between the transmission circuit and the reception circuit can be suppressed, and deterioration in reception sensitivity of a reception signal due to an unwanted wave from the transmission circuit can be suppressed.

In this modification, a magnetic flux direction of the second inductor of the impedance matching circuit 61D is a direction perpendicular to the main surface 91a. The second inductor of the impedance matching circuit 61D includes a spiral planar coil conductor, and its winding axis is perpendicular to the main surface 91a.

According to this configuration, the magnetic flux direction of the second inductor of the impedance matching circuit 61D and the magnetic flux direction of the third inductor of the impedance matching circuit 52D are orthogonal to each other, so that the magnetic field coupling between them can be suppressed. Therefore, it is possible to further suppress the invasion of an unwanted wave from the transmission circuit to the reception circuit, so that the deterioration in the reception sensitivity of a reception signal can be suppressed.

Note that the definition of the magnetic flux direction of the inductor of each impedance matching circuit according to the present modification can also be applied to the radio frequency module 1 according to the embodiment, and also to the radio frequency modules according to the first modification to the fourth modification. That is, the magnetic flux direction of the third inductor of the impedance matching circuit 52 configuring the transmission circuit may be a direction parallel to the main surfaces 91a and 91b, and the magnetic flux directions of the first inductors of the impedance matching circuits 62, 62A, 62C, 62D and 62E configuring the reception circuits, and the magnetic flux directions of the second inductors of the impedance matching circuits 61, 61A and 61D may be a direction perpendicular to the main surfaces 91a and 91b.

Other Embodiments, or the Like

Although the radio frequency module and the communication device according to the embodiment of the present disclosure have been described with reference to the embodiment and modifications thereof, the radio frequency module and the communication device according to the present disclosure are not limited to the above embodiment and modifications thereof. Other embodiments achieved by combining arbitrary constituent elements in the above embodiment and modifications thereof, modifications obtained by a person skilled in the art without departing from the spirit and scope of the present disclosure with respect to the above embodiment and modifications thereof, and various devices incorporating the radio frequency module and the communication device are also included in the present disclosure.

For example, in the radio frequency module and the communication device according to the above embodiment and the modifications thereof, another circuit element, wiring, or the like may be inserted between each circuit element and the path connecting signal paths disclosed in the drawings.

The present disclosure is widely applicable to a communication device such as a mobile phone as a radio frequency module to be disposed in a front-end unit compatible with multiband.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A radio frequency module comprising:
a mounting substrate;
a low-noise amplifier that includes an amplifying element and that amplifies a radio frequency signal;
a power amplifier that amplifies a power of a radio frequency signal;
a third inductor connected to an output terminal of the power amplifier and mounted on the main surface without being laminated with the power amplifier; and
a first integrated passive element including an integrated first inductor,
wherein the first inductor is connected to an input terminal of the low-noise amplifier, the low-noise amplifier and the first integrated passive element are laminated in a direction perpendicular to a main surface of the mounting substrate, and
a first multilayer body in which the low-noise amplifier and the first integrated passive element are laminated is mounted on the main surface.

2. The radio frequency module according to claim 1, wherein the low-noise amplifier includes a first substrate on which the amplifying element is mounted,
the first integrated passive element includes a second substrate on which the first inductor is integrated and mounted, and
the first substrate and the second substrate are made of silicon.

3. The radio frequency module according to claim 1, wherein the first inductor is an impedance matching element for matching an output impedance of a circuit element arranged in a preceding stage of the low-noise amplifier with an input impedance of the low-noise amplifier.

4. The radio frequency module according to claim 2, wherein the first inductor is an impedance matching element for matching an output impedance of a circuit element arranged in a preceding stage of the low-noise amplifier with an input impedance of the low-noise amplifier.

5. The radio frequency module according to claim 1, further comprising:
an input/output terminal that inputs and outputs a radio frequency signal; and
a switch that switches a connection between a signal path for transmitting a radio frequency signal input to the low-noise amplifier and the input/output terminal, and a connection between a signal path for transmitting a radio frequency signal output from the power amplifier and the input/output terminal,
wherein the switch is arranged between the power amplifier and the first multilayer body in a plan view of the main surface.

6. The radio frequency module according to claim 5, further comprising:
a second integrated passive element including an integrated second inductor,
wherein the switch and the second integrated passive element are laminated in a direction perpendicular to the main surface, and
a second multilayer body in which the switch and the second integrated passive element are laminated is mounted on the mounting substrate.

7. The radio frequency module according to claim 6, further comprising:
a resin member that is disposed on the main surface and that covers at least a part of the power amplifier, the first multilayer body, and the second multilayer body,
wherein the low-noise amplifier is arranged between the mounting substrate and the first integrated passive element in a cross-sectional view of the mounting substrate,
the switch is arranged between the mounting substrate and the second integrated passive element in a cross-sectional view of the mounting substrate, and
the power amplifier, the first integrated passive element, and the second integrated passive element are exposed from a top surface of the resin member.

8. The radio frequency module according to claim 7, further comprising:
a shield electrode layer configured to cover a top surface and side surfaces of the resin member, the shield electrode layer being connected to a ground electrode in the mounting substrate.

9. The radio frequency module according to claim 1, wherein a magnetic flux direction of the first inductor is a direction perpendicular to the main surface, and
a magnetic flux direction of the third inductor is a direction parallel to the main surface.

10. The radio frequency module according to claim 5, wherein a magnetic flux direction of the first inductor is a direction perpendicular to the main surface, and
a magnetic flux direction of the third inductor is a direction parallel to the main surface.

11. The radio frequency module according to claim 1, wherein the mounting substrate has a first main surface and a second main surface opposite to each other,
the power amplifier and the third inductor are mounted on the first main surface, and
the first multilayer body is mounted on the second main surface.

12. A radio frequency module comprising:
a mounting substrate;
a low-noise amplifier that includes an amplifying element and that amplifies a radio frequency signal; and
a first integrated passive element including an integrated first inductor,
wherein the first inductor is connected to an input terminal of the low-noise amplifier,
the low-noise amplifier and the first integrated passive element are laminated in a direction perpendicular to a main surface of the mounting substrate, and
a first multilayer body in which the low-noise amplifier and the first integrated passive element are laminated is mounted on the main surface,
wherein the first integrated passive element is arranged between the mounting substrate and the low-noise amplifier in a cross-sectional view of the mounting substrate.

13. The radio frequency module according to claim 2, wherein the first integrated passive element is arranged between the mounting substrate and the low-noise amplifier in a cross-sectional view of the mounting substrate.

14. The radio frequency module according to claim 3, wherein the first integrated passive element is arranged between the mounting substrate and the low-noise amplifier in a cross-sectional view of the mounting substrate.

15. A communication device comprising:
an RF signal processing circuit that processes a radio frequency signal to be transmitted and received by an antenna element; and
a radio frequency module which transmits the radio frequency signal between the antenna element and the RF signal processing circuit according to claim 1.

16. A communication device comprising:
an RF signal processing circuit that processes a radio frequency signal to be transmitted and received by an antenna element; and
a radio frequency module which transmits the radio frequency signal between the antenna element and the RF signal processing circuit according to claim 2.

17. A communication device comprising:
an RF signal processing circuit that processes a radio frequency signal to be transmitted and received by an antenna element; and a radio frequency module which transmits the radio frequency signal between the antenna element and the RF signal processing circuit according to claim 3.

\* \* \* \* \*